US007022612B2

(12) United States Patent
Hillyer et al.

(10) Patent No.: US 7,022,612 B2
(45) Date of Patent: Apr. 4, 2006

(54) METHOD OF REMOVING ETCH RESIDUES

(75) Inventors: Larry Hillyer, Boise, ID (US); Max F. Hinerman, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 219 days.

(21) Appl. No.: 10/627,151

(22) Filed: Jul. 24, 2003

(65) Prior Publication Data

US 2004/0157462 A1 Aug. 12, 2004

Related U.S. Application Data

(63) Continuation of application No. 09/141,812, filed on Aug. 28, 1998, now Pat. No. 6,613,681.

(51) Int. Cl.
*H01L 21/302* (2006.01)
*H01L 21/461* (2006.01)

(52) U.S. Cl. ....................... 438/706; 438/704; 438/718

(58) Field of Classification Search ................ 438/704, 438/700, 718, 706, 906
See application file for complete search history.

(56) References Cited

U.S. PATENT DOCUMENTS

| | | | | |
|---|---|---|---|---|
| 5,017,265 | A | 5/1991 | Park et al. | |
| 5,174,856 | A | 12/1992 | Hwang et al. | |
| 5,200,031 | A | 4/1993 | Latchford et al. | |
| 5,228,950 | A | 7/1993 | Webb et al. | |
| 5,269,878 | A | 12/1993 | Page et al. | |
| 5,281,850 | A | 1/1994 | Kanamori et al. | |
| 5,310,626 | A | 5/1994 | Fernandes et al. | |
| 5,358,599 | A | 10/1994 | Cathey et al. | |
| 5,514,247 | A | 5/1996 | Shan et al. | |
| 5,545,289 | A | 8/1996 | Chen et al. | |
| 5,661,083 | A | 8/1997 | Chen et al. | |
| 5,667,630 | A | 9/1997 | Lo | |
| 5,783,459 | A | 7/1998 | Suzuki et al. | |
| 5,811,022 | A | 9/1998 | Savas et al. | |
| 5,814,156 | A | 9/1998 | Elliott et al. | |
| 5,849,367 | A | 12/1998 | Dixit et al. | |
| 5,849,639 | A | 12/1998 | Molloy et al. | |
| 5,977,041 | A | 11/1999 | Honda | |
| 5,986,344 | A | 11/1999 | Subramanion et al. | |
| 6,613,681 | B1 * | 9/2003 | Hillyer et al. | 438/704 |

FOREIGN PATENT DOCUMENTS

WO WO 93/17453 9/1993

* cited by examiner

*Primary Examiner*—Alexander Ghyka
(74) *Attorney, Agent, or Firm*—Knobbe, Martens, Olson & Bear, LLP

(57) ABSTRACT

Organic etch residues are often left within vias formed by etching through resist masks. Since the etch is designed to expose an underlying metal layer and is directional in order to produce vertical via sidewalls, the residue often incorporates metal. The present invention discloses a method of removing such etch residues while passivating exposed metal, including exposing the residue to ammonia. In the disclosed embodiment, ammonia and oxygen are mixed in a plasma step, such that the resist can be burned off at the same time as the residue treatment. The residue can thus be easily rinsed away.

20 Claims, 3 Drawing Sheets

METHOD OF REMOVING ETCH RESIDUES

REFERENCE TO RELATED APPLICATION

This application is a continuation of application Ser. No. 09/141,812, filed Aug. 28, 1998 U.S. Pat. No. 6,613,681.

FIELD OF THE INVENTION

The present invention relates generally to the removal of residues during fabrication of integrated circuits. More particularly, the invention relates to the removal of residues after opening vias for contact information.

BACKGROUND OF THE INVENTION

During fabrication of integrated circuits, it is often necessary to construct vias to interconnect metal lines or other devices in the semiconductor. These vias, are etched through an insulating layer to expose a metal or other conductive element below. The insulating layer is typically a form of oxide, such that fluorocarbons are used to etch through the insulating layers. In plasma etch reactors, the wafer is often subjected to an electrical bias to obtain more uniform etching. Biasing the wafer also greatly increases the rate of etching.

Organic residues are left in the via after the etching process. These residues can compromise the reliability of the contact to be formed within the via, and should therefore be removed. Typically, the residue is removed with an organic stripper, which simultaneously strips the resist mask. Such organic strips are expensive and difficult to dispose, however, such that oxygen plasma is more currently favored to burn off the resist and etch residue.

More recently, fluorine has been added to an oxygen plasma strip, aiding the complete removal of the residue by undercutting the oxide walls. Unfortunately, the fluorine also undercuts the metal and can also laterally recess upper layers of the metal. If this lateral recessing causes a gap between the dielectric and the metal line below, filling the via with conductive material to form a contact between two layers will be incomplete, and the resulting contact will have reliability problems.

U.S. Pat. No. 5,661,083 discloses reactive ion etches to clear the via walls. These etches also entail reliability issues due to metallic recessing, as well as safety problems from use of explosive mixtures and dimension control.

Accordingly, there is a need for a method of effectively removing residue from etching a via. Desirably, the method should protect the via surfaces, and particularly the metal layers exposed by the via etch.

SUMMARY OF THE INVENTION

In accordance with one aspect of the invention, a method is provided for fabricating a conductive contact through an insulating layer in an integrated circuit. A via is first etched through the insulating layer to expose a first metal element. The via sidewall is then exposed to a vapor formed, at least in part, from ammonia. Thereafter, a conductive material is deposited into the via.

In accordance with another aspect of the invention, a method is disclosed for removing etch residue from the via after the via has been etched through an insulating layer in a partially fabricated integrated circuit assembly. The etch residue is exposed to a plasma formed from a non-explosive source of hydrogen and oxygen. In accordance with still another aspect of the invention, a method is provided for forming an integrated circuit. A patterned mask is formed from a resist layer over a dielectric layer. A via is then formed in the dielectric layer by etching through the mask. This via is cleaned by exposure to a plasma generated from ammonia.

BRIEF DESCRIPTION OF THE DRAWINGS

These and other aspects of the invention will be apparent to the skilled artisan from the detailed description and claims below, taking together with the attached drawings, wherein:

DETAILED DESCRIPTION OF THE PREFERRED EMBODIMENT

The present invention is directed to cleaning surfaces of integrated circuits during fabrication. While illustrated in the context of removing residue from within a via following a contact etch, the skilled artisan will recognize many other applications for the methods disclosed herein.

Figure 1:
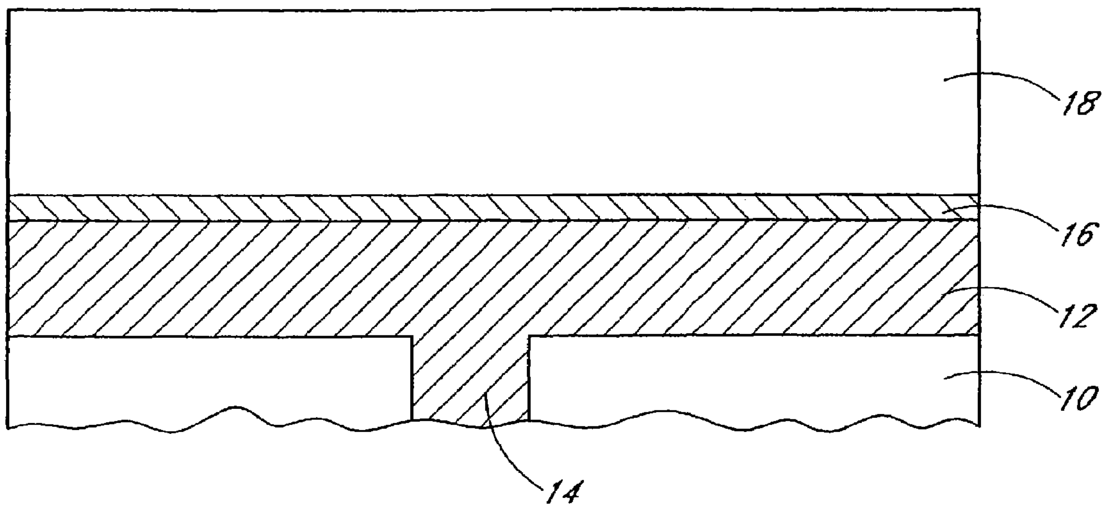
FIG. 1 is a cross-sectional view of a partially fabricated integrated circuit, wherein a conducting layer, and a dielectric layer have been formed over a substrate.

FIG. 1 shows an insulating layer 10, such as BPSG. While not shown, the insulating layer 10 is formed over a substrate in which electrical devices are formed (e.g., integrated transistors). The substrate may be a semiconductor such as silicon or gallium arsenide, or it may be an insulating layer if Silicon-On-Insulator (SOI) or a similar technology is used. For example, the insulator may be sapphire, if Silicon-On-Sapphire (SOS) is used. The term substrate is therefore meant to be inclusive of various technologies known to those skilled in the art. The insulating layer 10 thus covers and electrically isolates the electrical devices from one another and from wiring layers to be formed.

A first conductive layer 12, formed over the insulating layer, may be a metal, silicide, or other suitable material. Some examples of suitable metals for forming the first conductive layer 12 include, but are not limited to, copper, gold, aluminum, silicon, and the like. Mixtures of metals are also suitable for forming a conducting layer. Some suitable mixtures of metals include, but are not limited to, aluminum alloys formed with copper and/or silicon. Some exemplary methods of depositing the conductive layer include, but are not limited to, Rapid Thermal Chemical Vapor Deposition (RTCVD), Low Pressure Chemical Vapor Deposition (LPCVD), and Physical Vapor Deposition (PVD).

The first conductive layer 12 is electrically connected to the underlying devices of the integrated circuit assembly. In the illustrated embodiments, a contact 14 is formed integrally with the first conductive layer 12. Such an integral contact is typically formed between wiring or conducting layers. In other arrangements, however, the contact makes direct contact to a transistor active area within the substrate.

Such contacts to active areas typically comprise polysilicon or tungsten plugs, as will be recognized by the skilled artisan.

An anti-reflective coating (ARC) 16 is preferably formed adjacent to the first conductive layer 12. The anti-reflective 16 coating can comprise any of a variety of materials suitable for its purpose. As is known in the art, the ARC 16 serves to reduce reflections of light energy during photolithographic patterning prior to etching the metal layer 12. The anti-reflective coating 16 of the illustrated embodiment comprises titanium nitride (TiN).

An interlevel dielectric layer (ILD) 18 is then deposited over the anti-reflective coating 16. The dielectric layer 18 preferably comprises a form of silicon oxide and the illustrated ILD 18 is formed by reaction of TEOS (tetraethyl orthosilicate) in a plasma deposition chamber 18. In other arrangements, silicon oxide can be formed by reaction between silane and nitrous oxide or oxygen. The skilled artisan will understand, however, that a variety of materials can be used for the ILD 18.

Figure 2:
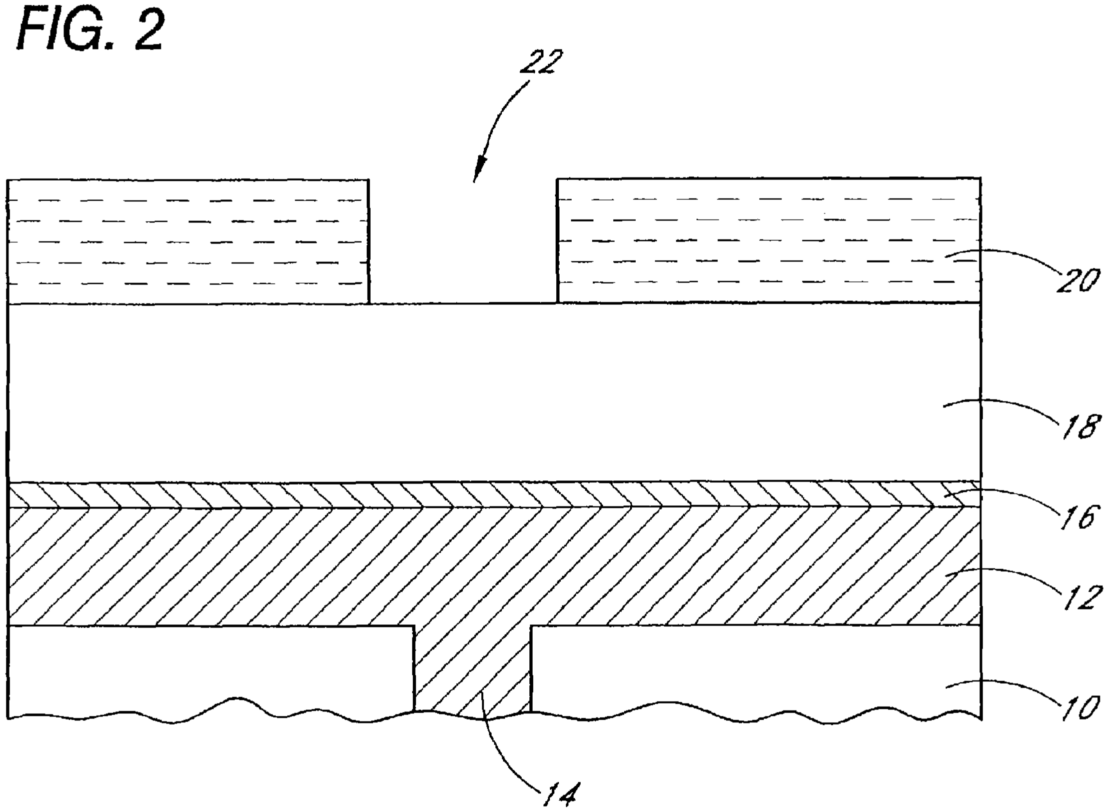
FIG. 2 illustrates the integrated circuit of FIG. 1 following deposition patterning of a mask of a layer.

With reference to FIG. 2, a suitable masking material is deposited onto the dielectric layer 18 of the integrated circuit assembly. In accordance with conventional photolithographic processes, the mask material preferably comprises a photo-definable organic resist layer 20. FIG. 2 shows the resist layer 20 after patterning to form an opening 22. In practice, it will be understood that multiple openings are formed across the wafer.

Figure 3:
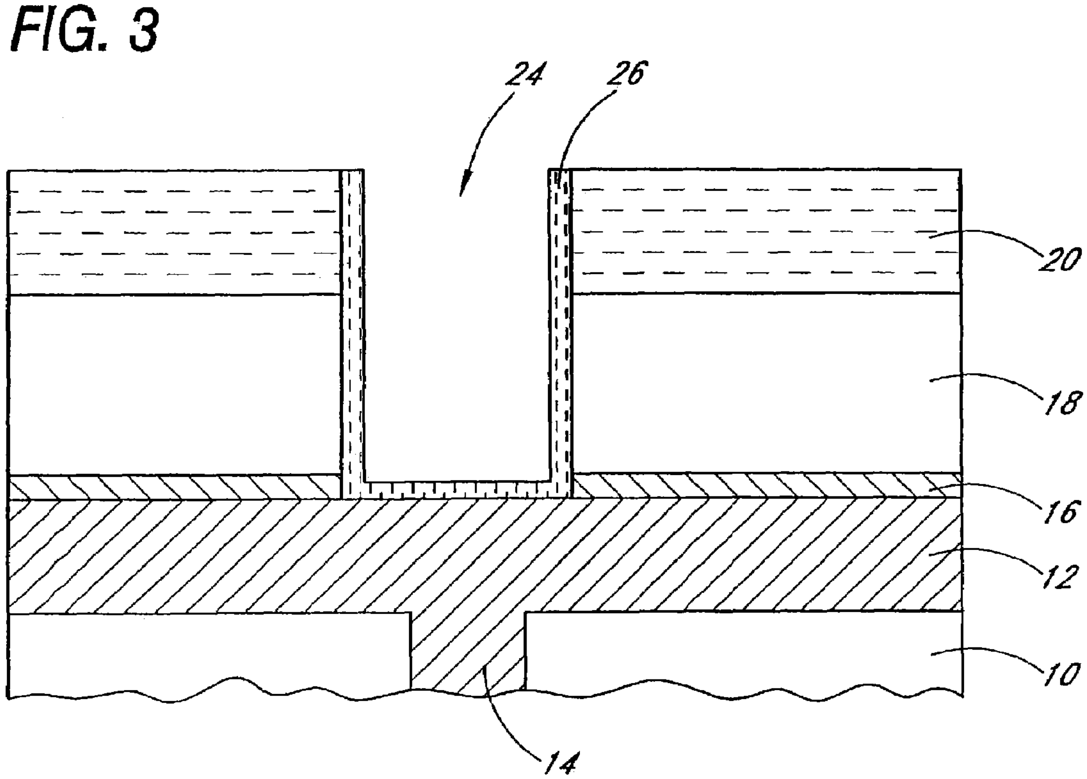
FIG. 3 illustrates the integrated circuit of FIG. 2 after a via has been etched through the dielectric layer, leaving residue lining the via.

As shown in FIG. 3, a via 24 is then etched through the dielectric layer 18 to expose a circuit element below. The etch process can be performed in a variety of manners. Preferably, the etch is directional and includes a physical component, thereby facilitating vertical sidewalls. As is conventional, the contact opening is "overetched" to ensure each opening exposes the underlying circuit across the substrate, despite any non-uniformities in ILD 18 thickness across the wafer. Furthermore, the via 24 preferably extends through the anti-reflective coating 16 to expose the conductive layer 12.

In the illustrated embodiment, the etch comprises a plasma etch, and more particularly a reactive ion etch (RIE) formed of a fluorocarbon chemistry (e.g., $CF_4$). Such an etch can be performed, for example, in a magnetically enhanced RIE chamber commercially available from Applied Materials, Inc. of Santa Clara, Calif. under the trade name "5000 MXP." Exemplary parameters include a chamber pressure of about 150 mTorr, RF power of about 900 W, magnetic field strength of about 50 Gauss, with the following gas flows: 111 sccm of Ar; 28 sccm of $N_2$; 15 sccm of $CHF_3$; and 60 sccm of $CF_4$. The skilled artisan will recognize, however, that each of the above noted parameters can be varied significantly, and furthermore that different etch chemistries can be used, while still obtaining effective anisotropic etching of the via 24.

The wafer is biased during the preferred RIE, thus increasing the rate of etching and the directionality of the etch. Furthermore, biasing physically etches through the ARC 16 without the aid of metal etchants such as chlorine. By the same token, however, the sputtering effect of this physical etch increases the metal content of the residue.

As also shown in FIG. 3, an etch residue or debris 26 is left in the via 24. after the etch process. The residue 26 typically includes the chemical species used to create the etch plasma, in addition to atoms from the conductive layer 12, the anti-reflective coating layer 16, the dielectric layer 18, and the resist layer 20. The presence of the resist 20 contributes to the creation of a complex polymeric matrix, incorporating metals and etchant components. As the residue 26 interferes with electrical contact through the via 24, it should be removed.

Conventional, post-etch cleaning steps are unsatisfactory, however. The metal content within the polymeric matrix makes the removal difficult. Moreover, the oxygen plasma tends to oxidize the residual metals as well as the exposed conductive layer 12. The addition of fluorine, while helpful in removing the residue, laterally attacks the preferred TiN anti-reflective coating 16 and also increases the fluorine at the surface of the underlying metal 12.

Figure 4:
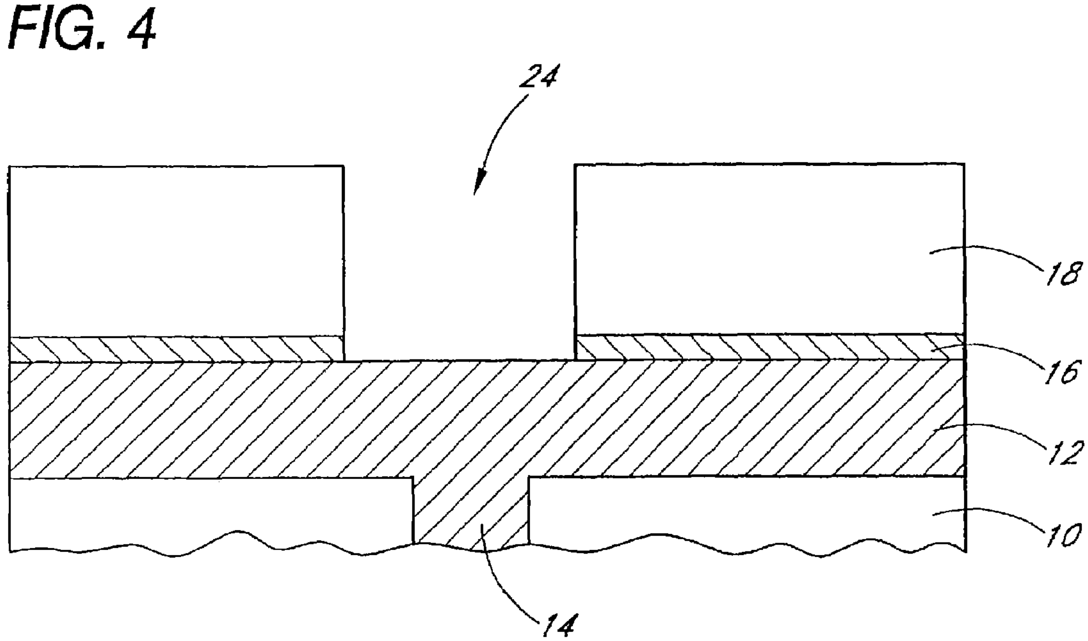
FIG. 4 illustrates the integrated circuit of FIG. 3 after removal of the residue and mask layer in accordance with the preferred embodiment.

FIG. 4 shows the contact after the resist 20 and residue 26 have been removed. In accordance with the preferred embodiment of the present invention, the residue 26 is treated to aid removal of the residue 26 without excessive oxidation. Preferably, the residue 26 is exposed to a vapor or plasma with a reducing chemistry, more preferably including a nonexplosive source of hydrogen atoms. In the illustrated embodiment, the residue 26 is exposed to a plasma formed of ammonia ($NH_3$). In other arrangements, water can also serve as a nonexplosive source of hydrogen.

Preferably, the plasma also comprises air or oxygen. The residue treatment is thus combined with burning the resist layer 20. Due to use of a nonexplosive source of hydrogen atoms, in combination with the oxygen or air, the preferred embodiment can safely treat the residue 26 while at the same time removing the resist layer 20 from the surface of the integrated circuit. In other arrangements, where the resist strip is separately performed, methane or hydrogen gas could be used to treat the residue 26.

The hydrogen in the plasma treatment passivates the metal atoms present in the residue, as well as the underlying first conductive layer 12, thus inhibiting oxidation of the metal. At the same time, the preferred plasma treatment facilitates removal of the residue 26.

The plasma can be generated with a variety of instruments. For example, the invention has been implemented in microwave strippers sold under the trade names MCU™ or Gemini™, produced by Fusion of Rockville, Md. Aspen II™ produced by Matson of California, is a commercially available inductively coupled plasma reactor. Each of these reactors have been found suitable for generating a plasma suitable for removing polymeric debris from vias, according to the preferred embodiment.

The percentage of ammonia in the ammonia/oxygen mix used to generate the plasma is preferably greater than or equal to about 25%. More preferably, ammonia comprises about 50% to 100% of the ammonia/oxygen mix. In an exemplary implementation, the flow rates of $NH_3$ and $N_2$ were about equal, at about 2 L/min. Reactor pressure was maintained at approximately 1.5 Torr. Temperatures of the substrate are preferably maintained at about 100–400° C., and was maintained at about 270° C. in the exemplary implementation. In the Fusion reactors, microwave power was set to approximately 1,900 watts. In the inductively coupled plasma reactor from Matson, a power of approximately 975 watts was used. The skilled artisan can readily determine an appropriate power level to effect dissociation of the constituent gases and thus activate the plasma for a given reactor.

After the residue 26 is treated with the hydrogen-containing gas, the integrated circuit is preferably rinsed to remove the treated residue. For example, in an exemplary implementation, the substrate was dipped in a dilute phosphoric acid solution, such as an aqueous solution of at least about 5% phosphoric acid in water, giving a pH of approximately 1.8. Alternatively, the wafer may be dipped in hot deionized water or subjected to isopropyl alcohol vapor (i.e., a Margoni rinse) after the ammonia treatment.

Figure 5:
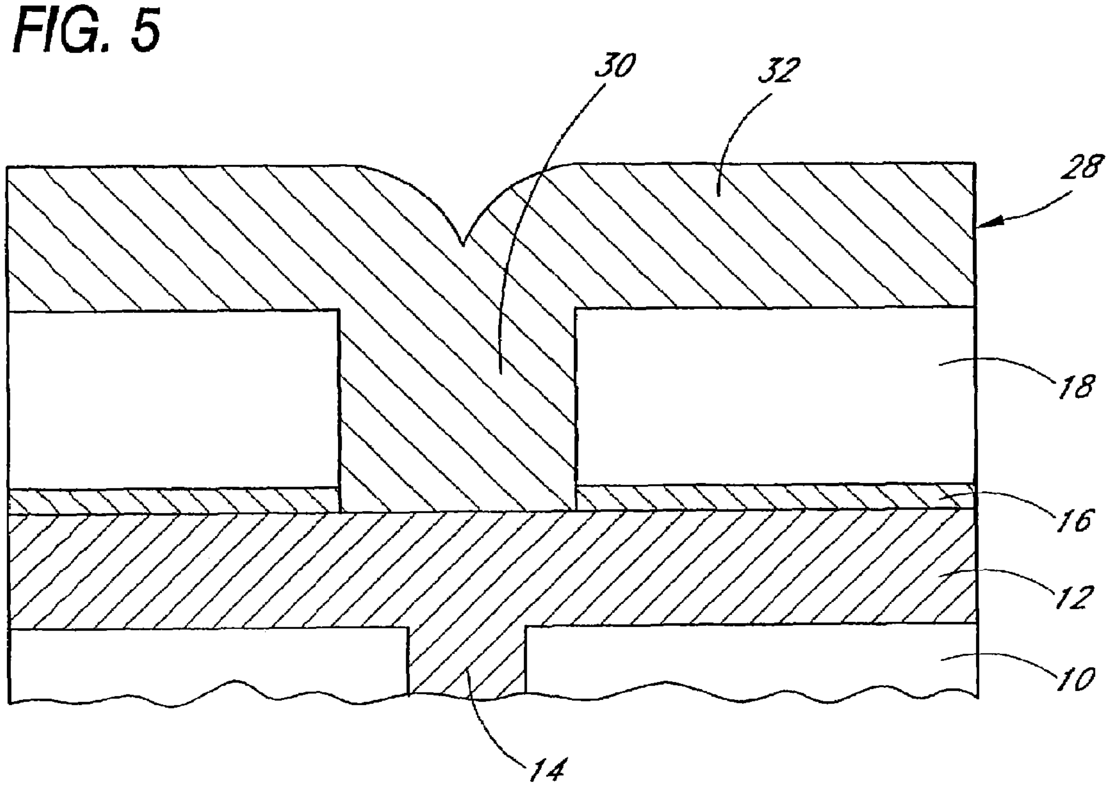
FIG. 5 illustrates the integrated circuit of FIG. 4 after the via has been filled with conductive material to form a contact.

As shown in FIG. 5, after the residue 26 has been removed from the via 24 by treatment and rinse, a second conductive layer 28 is deposited over the dielectric layer 18 and into the opening 24, thus forming a contact 30 to the first conductive layer 12. Suitable conductive materials for forming the second conductive layer 28 include aluminum, gold, copper, copper, silicon, and alloys of such metals.

In the illustrated embodiment, the conductive material deposited to form the contact also forms a metal wiring layer 32 above the contact, which can then be patterned into metal runners. The skilled artisan will readily recognize that the described method of cleaning vias is also applicable to damascene and dual damascene processes. Alternatively, the cleaned via 24 can be filled with a conductive material which is etched back to leave an. isolated conductive plug, typically formed of tungsten, metal silicides or polysilicon. The integrated circuit can then be completed by methods well known to those skilled in the art.

Advantageously, the preferred embodiments enable a fast, highly directional etch, while at the same time leaving a via free of impurities which might otherwise affect contact resistivity and reliability.

Various modifications and alterations of this invention will be apparent to those skilled in the art without departing from the scope and spirit of this invention. It should be understood that the invention is not limited to the embodiments disclosed therein, and the claims should be interpreted as broadly as the prior art allows.

What is claimed is:

1. A method of forming and cleaning a via in a partially fabricated integrated circuit having a top, wherein the integrated circuit comprises a metal layer, an anti-reflective coating above the metal layer, and a dielectric layer above the anti-reflective coating, the method comprising:

depositing an organic resist layer on the top of the partially fabricated integrated circuit;

forming an opening in the resist layer;

etching a via through the opening in the resist layer, wherein the via extends through the dielectric layer and the anti-reflective coating, thereby exposing the metal layer; and cleaning the via by exposing the via to a plasma that simultaneously removes the resist layer, wherein the plasma is formed from a gas comprising ammonia.

2. The method of claim 1, wherein the gas comprises oxygen.

3. The method of claim 1, wherein the gas comprises at least 25% ammonia.

4. The method of claim 3, wherein the gas comprises at least about 50% ammonia.

5. The method of claim 1, wherein exposing the via to a plasma occurs at a temperature between about 100° and about 400° C.

6. The method of claim 1, wherein the dielectric layer comprises an oxide.

7. The method of claim 1, wherein etching a via comprises a plasma etch.

8. The method of claim 1, further comprising depositing a conductive material into the via after cleaning the via.

9. A method of forming and cleaning a void in a partially fabricated integrated circuit comprising:

depositing a resist layer on a top of the partially fabricated integrated circuit;

forming an aperture in the resist layer;

etching a void through the aperture in the resist layer and through an underlying dielectric layer to expose a metal layer, thereby forming a residue in the void; and removing the resist layer and the residue from the void by exposing the partially fabricated integrated circuit to a plasma formed from a gas comprising ammonia and rinsing the exposed void.

10. The method of claim 9, wherein the residue comprises metal from the metal layer.

11. The method of claim 9, wherein etching the void comprises performing a directional etch.

12. The method of claim 11, wherein etching the void comprises a reactive ion etch.

13. The method of claim 12, wherein a radio frequency power is set to at least about 900 W during the reactive ion etch.

14. The method of claim 12, wherein the reactive ion etch is magnetically enhanced.

15. The method of claim 9, wherein etching through the mask comprises etching through a metal covering layer situated between the first metal layer and the dielectric layer.

16. The method of claim 15, wherein the metal covering layer comprises an antireflection layer.

17. The method of claim 15, wherein the metal covering layer comprises titanium nitride.

18. The method of claim 9, wherein rinsing the exposed void comprises dipping the integrated circuit into a dilute phosphoric acid bath.

19. The method of claim 9, wherein rinsing the exposed void comprises exposing a void sidewall to deionized water.

20. The method of claim 9, wherein rinsing the exposed void comprises exposing a void sidewall to isopropyl alcohol.

* * * * *

UNITED STATES PATENT AND TRADEMARK OFFICE

CERTIFICATE OF CORRECTION

PATENT NO. : 7,022,612 B2
APPLICATION NO. : 10/627151
DATED : April 04, 2006
INVENTOR(S) : Hillyer et al.

It is certified that error appears in the above-identified patent and that said Letters Patent is hereby corrected as shown below:

Title Page Item (75) (Inventors); Line 2; Delet “Hinerman” and insert --Hineman--, therefor.

Signed and Sealed this

Fourteenth Day of November, 2006

JON W. DUDAS
*Director of the United States Patent and Trademark Office*